(12) United States Patent
Tachibana et al.

(10) Patent No.: US 10,434,608 B2
(45) Date of Patent: Oct. 8, 2019

(54) LEAD-FREE SOLDER, LEAD-FREE SOLDER BALL, SOLDER JOINT USING THE LEAD-FREE SOLDER AND SEMICONDUCTOR CIRCUIT HAVING THE SOLDER JOINT

(71) Applicant: Senju Metal Industry Co., Ltd., Tokyo (JP)

(72) Inventors: Ken Tachibana, Chiba-ken (JP); Yuya Nagasawa, Hyogo-ken (JP)

(73) Assignee: Senju Metal Indsutry Co., Ltd., Tokyo (JP)

( * ) Notice: Subject to any disclaimer, the term of this patent is extended or adjusted under 35 U.S.C. 154(b) by 835 days.

(21) Appl. No.: 14/916,730

(22) PCT Filed: May 21, 2014

(86) PCT No.: PCT/JP2014/063481
§ 371 (c)(1),
(2) Date: Mar. 4, 2016

(87) PCT Pub. No.: WO2015/037279
PCT Pub. Date: Mar. 19, 2015

(65) Prior Publication Data
US 2016/0214212 A1 Jul. 28, 2016

(30) Foreign Application Priority Data
Sep. 11, 2013 (JP) ................. 2013-188406

(51) Int. Cl.
| | | |
|---|---|---|
| C22C 13/02 | (2006.01) | |
| B23K 35/26 | (2006.01) | |
| C22C 13/00 | (2006.01) | |
| H01L 23/00 | (2006.01) | |
| B23K 35/02 | (2006.01) | |
| H01L 23/498 | (2006.01) | |
| B23K 101/40 | (2006.01) | |

(52) U.S. Cl.
CPC ........ B23K 35/262 (2013.01); B23K 35/0244 (2013.01); C22C 13/00 (2013.01); C22C 13/02 (2013.01); H01L 24/13 (2013.01); *B23K 2101/40* (2018.08); *H01L 23/49816* (2013.01); *H01L 23/49866* (2013.01); *H01L 2224/13113* (2013.01); *H01L 2224/13139* (2013.01); *H01L 2224/16238* (2013.01); *H01L 2224/45144* (2013.01); *H01L 2224/48091* (2013.01); *H01L 2224/48229* (2013.01); *H01L 2924/15311* (2013.01)

(58) Field of Classification Search
CPC ...................................................... C22C 13/02
See application file for complete search history.

(56) References Cited

U.S. PATENT DOCUMENTS

| | | | |
|---|---|---|---|
| 6,365,097 | B1 | 4/2002 | Yamashita et al. |
| 8,845,826 | B2 | 9/2014 | Kawamata et al. |
| 2003/0015575 | A1 | 1/2003 | Yamaguchi et al. |
| 2011/0204121 | A1 | 8/2011 | Kawamata et al. |
| 2012/0061823 | A1 | 3/2012 | Wu et al. |

FOREIGN PATENT DOCUMENTS

| | | |
|---|---|---|
| CN | 1570166 A | 1/2005 |
| CN | 102066042 A | 5/2011 |
| JP | 2000015476 A | 1/2000 |
| JP | 2000288772 A | 10/2000 |
| JP | 2002096191 A | 4/2002 |
| JP | 2005153007 A | 6/2005 |
| JP | 3693762 B2 | 9/2005 |
| JP | 2014217888 A | 11/2014 |
| KR | 1020120027058 A | 3/2012 |
| WO | 2009011341 A1 | 1/2009 |
| WO | 2009131178 A1 | 10/2009 |

*Primary Examiner* — Christopher S Kessler
(74) *Attorney, Agent, or Firm* — The Webb Law Firm (57) ABSTRACT

Lead-free solder is characterized in that the lead-free solder contains Ag of 1.2 mass % through 4.5 mass %, Cu of 0.25 mass % through 0.75 mass %, Bi of 1 mass % through 5.8 mass %, Ni of 0.01 mass % through 0.15 mass % and Sn as the remainder. These addition amounts allow to be further improved the common solder properties such as wettability, shear strength properties and the like, in addition to the thermal fatigue resistance.

16 Claims, 3 Drawing Sheets

LEAD-FREE SOLDER, LEAD-FREE SOLDER BALL, SOLDER JOINT USING THE LEAD-FREE SOLDER AND SEMICONDUCTOR CIRCUIT HAVING THE SOLDER JOINT

CROSS-REFERENCE TO RELATED APPLICATIONS

This application is the United States national phase of International Application No. PCT/JP2014/063481 filed May 21, 2014, and claims priority to Japanese Patent Application No. 2013-188406 filed Sep. 11, 2013, the disclosures of which are hereby incorporated in their entirety by reference.

TECHNICAL FIELD

The present invention relates to lead-free solder, a lead-free solder ball, a solder joint using this lead-free solder and a semiconductor circuit having the solder joint, which are preferably used for a semiconductor package such as CSP, particularly, a wafer level semiconductor package (semiconductor chip) or the like.

BACKGROUND

Together with multi-functionality and miniaturization of electronic equipment such as a multifunctional terminal (smart phone) and a cellular phone, electronic components to be mounted in the electronic equipment also have a trend toward the miniaturization (micro-miniaturization).

Figure 1:
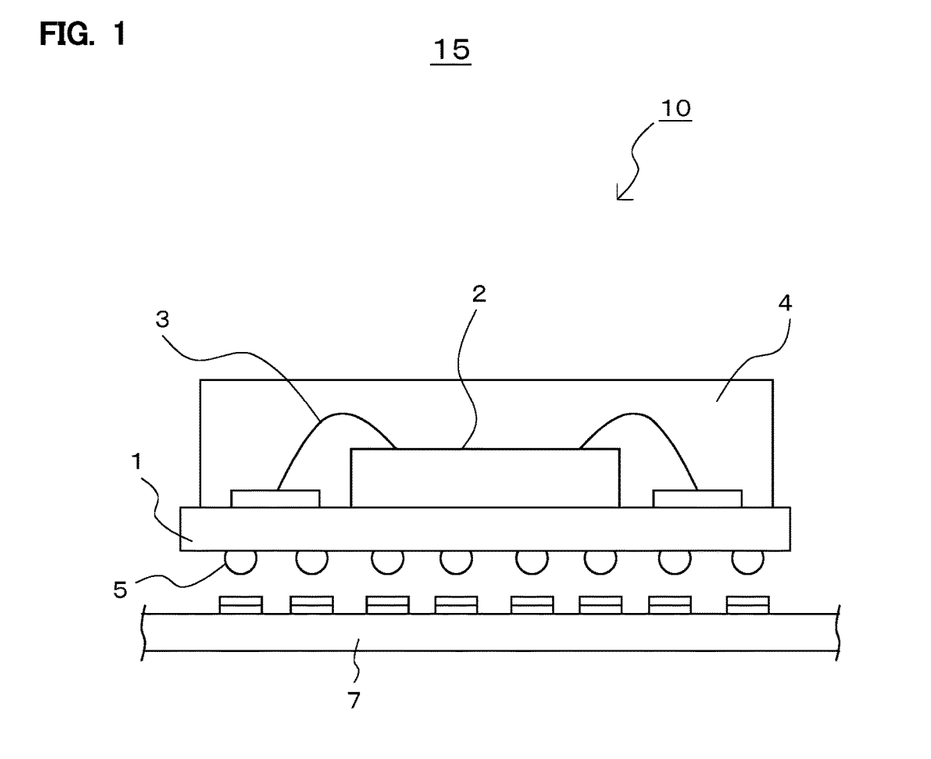
FIG. 1 is a sectional view of a CSP package concept showing an important portion thereof.

For example, the miniaturization advances even in a semiconductor package such as a chip size package (CSP) and the like so that a wafer level semiconductor package, WL-CSP (wafer level CSP) appears. FIG. 1 shows a sectional view of a CSP-typed semiconductor package (CSP package) showing an important portion thereof; and FIG. 2 shows a sectional view of a chip sized WL-CSP semiconductor package (WL-CSP chip) showing an important portion thereof.

In the CSP package 10 shown in FIG. 1, a semiconductor chip 2 mounted on an interposer 1 is molded by any resin while it connects electrodes of the interposer 1 by wire bonding 3 using Au line. 4 indicate this molded body.

A plurality of solder bump electrodes 5 is formed on an undersurface of the interposer 1 and solder balls shown in this figure are connected with these solder bump electrodes 5. CSP package 10 on which plural solder bump electrodes 5 are formed is mounted on a circuit board 7 so that a semiconductor circuit 15 is manufactured.

Figure 2:
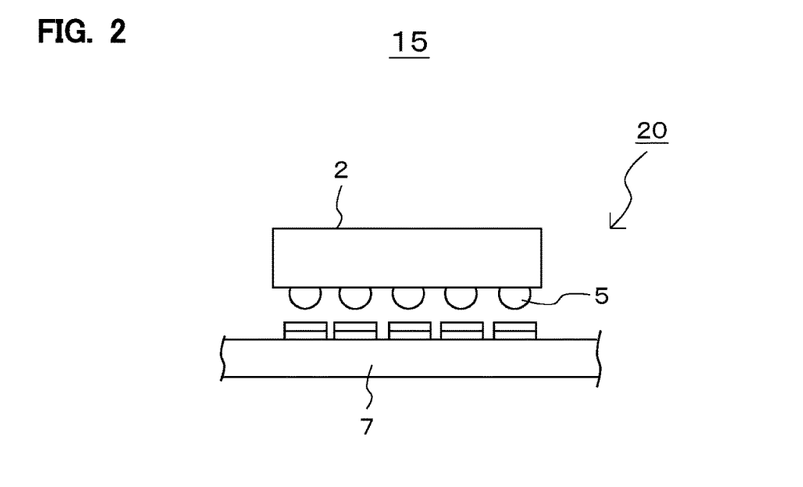
FIG. 2 is a sectional view of a WL-CSP chip concept showing an important portion thereof.

On the other hand, WL-CSP chip 20 is configured so that the interposer 1 and the molded body 4 are deleted and the plural solder bump electrodes 5 are directly connected with electrodes of the semiconductor chip 2 as shown in FIG. 2.

The CSP package 10 has a package size of about 10×10 mm because the interposer 1 is interposed therein while the WL-CSP chip 20 theoretically has a chip size of (for example, about 4×4 mm). Therefore, the WL-CSP chip 20 can reduce its occupied area substantially on a substrate having a package size, which allows a very high density semiconductor circuit (implementation circuit) to be realized.

By the way, as evaluation properties (evaluation items) of the lead-free solder, which is used for solder balls or the like for joining in WL-CSP chip or the like, wettability (wetting extendability), shear strength properties (shear properties), thermal fatigue resistance (heat cycle characteristics: TCT) and the like are in general listed.

The wettability is a property that is required when forming a solder bump. The shear strength properties are properties that are required to keep strength on a joined interface between solder and each electrode on the substrate. Therefore, the wettability and the shear strength properties are solder properties required when principally joining the lead-free solder to a semiconductor package.

The thermal fatigue resistance is solder property required when principally implementing the semiconductor package on a circuit board. The thermal fatigue resistance is solder property required in a case where it is used in an on-vehicle electronic circuit or the like, which is used under any severe conditions in which there is a considerable change in temperature, or other case. This thermal fatigue resistance is also property to be studied in a case where there is a considerable difference in thermal expansion coefficients between a semiconductor package and a circuit board.

For example, there is an almost twofold difference in thermal expansion coefficients between the CSP package (particularly the interposer 1) and the circuit board (mounting substrate) 7 when mounting the CS package 10 on the circuit board as described above. On the other hand, there is an almost fivefold difference in thermal expansion coefficients between the package (semiconductor chip 2) and the circuit board 7 in WL-CSP chip 20. Accordingly, WL-CSP chip 20 receives any more considerably influence on thermal fatigue resistance of joined solder based on a repeat of heat and cold, which considerably affect reliability of an electronic circuit. Taking this into consideration, lead-free solder which considerably improves its thermal fatigue resistance has been proposed (see Patent Document 1).

The above-mentioned evaluation properties are solder properties required in a case where an electronic circuit is mounted on consumer electronics but in any uses thereof, solderability (solder properties) such as the above-mentioned wettability and shear strength properties is required together with the thermal fatigue resistance. Here, the consumer electronics refer to a cellular phone, a multifunctional terminal (smart phone), a personal computer and the like, other than well-known household electric appliance.

DOCUMENT FOR PRIOR ART

Patent Document

Patent Document 1: International Publication No. 2009/011341

SUMMARY OF THE INVENTION

Problem to Be Solved By the Invention

By the way, the lead-free solder (solder alloy including Sn, Ag, Cu, Bi, Ni or the like) disclosed in the Patent Document 1 has realized thermal fatigue resistance which conventional ternary alloy solder (Sn-3Ag-0.5 Cu or the like) could not obtain, but further improvement on the solder properties such as wettability, shear strength properties and the like is also important improvement theme. Particularly, in an electronic circuit to be mounted on a cellular phone or the like, micro-miniaturization of circuit elements has been progressed and the cellular phone has been often dropped during its use so that wettability, the shear strength properties and the like have also formed important property improvement factors.

Therefore, the present invention resolves such a conventional problem and is to provide lead-free solder, a lead-free solder ball, a solder joint using the lead-free solder and a semiconductor circuit having the solder joint, in which an attempt is made to further improve the solder properties such as the wettability, the shear strength properties and the like in addition to the thermal fatigue resistance.

Means for Solving the Problems

In order to resolve the above-mentioned problem, lead-free solder according to the invention is characterized in that the lead-free solder contains Ag of 1.2 mass % through 4.5 mass % (excluding 1.2 mass % through 1.5 mass %), Cu of 0.25 mass % through 0.75 mass %, Bi of 1 mass % through 5.8 mass % (excluding 1.0 mass % through 1.3 mass %), Ni that is more than 0.01 mass % and less than 0.1 mass % and Sn as the remainder.

Lead-free solder is characterized in that the lead-free solder contains Ag of 2 mass % through 4 mass %, Cu of 0.3 mass % through 0.75 mass %, Bi of 1 mass % through 5 mass % (excluding 1.0 mass % through 1.3 mass %), Ni that is 0.02 mass % and less than 0.1 mass % and Sn as the remainder.

Lead-free solder is characterized in that the lead-free solder contains Ag of 2.5 mass % through 3.5 mass %, Cu of 0.5 mass % through 0.75 mass %, Bi of 3 mass % through 5 mass %, Ni that is 0.03 mass % and less than 0.1 mass % and Sn as the remainder.

Lead-free solder is characterized in that a total amount of 0.0005 mass % through 0.05 mass % of at least one selected from the group consisting of P and Ge is added to the lead-free solder.

Lead-free solder ball is characterized in that the lead-free solder ball contains Ag of 1.2 mass % through 4.5 mass % (excluding 1.2 mass % through 1.5 mass %), Cu of 0.25 mass % through 0.75 mass %, Bi of 1 mass % through 5.8 mass % (excluding 1.0 mass % through 1.3 mass %), Ni that is more than 0.01 mass % and less than 0.1 mass % and Sn as the remainder.

Lead-free solder ball is characterized in that the lead-free solder ball contains Ag of 2 mass % through 4 mass %, Cu of 0.3 mass % through 0.75 mass %, Bi of 1 mass % through 5 mass % (excluding 1.0 mass % through 1.3 mass %), Ni that is 0.02 mass % and less than 0.1 mass % and Sn as the remainder.

Lead-free solder ball is characterized in that the lead-free solder ball contains Ag of 2.5 mass % through 3.5 mass %, Cu of 0.5 mass % through 0.75 mass %, Bi of 3 mass % through 5 mass %, Ni that is 0.03 mass % and less than 0.1 mass % and Sn as the remainder.

Lead-free solder ball is characterized in that a total amount of 0.0005 mass % through 0.05 mass % of at least one selected from the group consisting of P and Ge is added to the lead-free solder ball.

Solder Joint is characterized in that the lead-free solder containing Ag of 1.2 mass % through 4.5 mass % (excluding 1.2 mass % through 1.5 mass %), Cu of 0.25 mass % through 0.75 mass %, Bi of 1 mass % through 5.8 mass % (excluding 1.0 mass % through 1.3 mass %), Ni that is more than 0.01 mass % and less than 0.1 mass % and Sn as the remainder is used.

Solder Joint is characterized in that the lead-free solder containing Ag of 2 mass % through 4 mass %, Cu of 0.3 mass % through 0.75 mass %, Bi of 1 mass % through 5 mass % (excluding 1.0 mass % through 1.3 mass %), Ni that is 0.02 mass % and less than 0.1 mass % and Sn as the remainder is used.

Solder Joint is characterized in that the lead-free solder containing Ag of 2.5 mass % through 3.5 mass %, Cu of 0.5 mass % through 0.75 mass %, Bi of 3 mass % through 5 mass %, Ni that is 0.03 mass % and less than 0.1 mass % and Sn as the remainder is used.

Solder Joint is characterized in that the lead-free solder in which a total amount of 0.0005 mass % through 0.05 mass % of at least one selected from the group consisting of P and Ge is added to the lead-free solder composition is used.

Semiconductor circuit is characterized in that the lead-free solder containing Ag of 1.2 mass % through 4.5 mass % (that excludes 1.2 mass % through 1.5 mass %), Cu of 0.25 mass % through 0.75 mass %, Bi of 1 mass % through 5.8 mass % (excluding 1.0 mass % through 1.3 mass %), Ni that is more than 0.01 mass % and less then 0.1 mass % and Sn as the remainder is used.

Semiconductor circuit is characterized in that the lead-free solder containing Ag of 2 mass % through 4 mass %, Cu of 0.3 mass % through 0.75 mass %, Bi of 1 mass % through 5 mass % (excluding 1.0 mass % through 1.3 mass %), Ni that is 0.02 mass % and less than 0.1 mass % and Sn as the remainder is used.

Semiconductor circuit is characterized in that the lead-free solder containing Ag of 2.5 mass % through 3.5 mass %, Cu of 0.5 mass % through 0.75 mass %, Bi of 3 mass % through 5 mass %, Ni that is 0.03 mass % and less than 0.1 mass % and Sn as the remainder is used.

Semiconductor circuit is characterized in that a total amount of 0.0005 mass % through 0.05 mass % of at least one selected from the group consisting of P and Ge is added to the lead-free solder.

Effect of the Invention

According to this invention, in a solder alloy containing Sn, Ag, Cu, Bi, Ni and the like, it is possible to further improve the common solder properties such as wettability, the shear strength properties and the like in addition to the thermal fatigue resistance.

MODES FOR IMPLEMENTING THE INVENTION

Embodiments

The following will describe lead-free solder according to this invention referring to embodiments. In this invention, they relate to lead-free solder of quinary system, which contains Sn, Ag, Cu, Bi and Ni. Addition amounts thereof are as follows: Ag of 1.2 mass % through 4.5 mass % (excluding 1.2 mass % through 1.5 mass %), Cu of 0.25 mass % through 0.75 mass %, Bi of 1 mass % through 5.8 mass % (excluding 1.0 mass % through 1.3 mass %), Ni that is more than 0.01 mass % and less than 0.1 mass % and Sn as the remainder.

(1) Regarding Addition Amount (1.2 mass % through 4.5 mass %) of Ag

It is preferable that the addition amount of Ag is not less than 1.2 mass % and not more than 4.5 mass % ($1.2 \leq Ag \leq 4.5$) (excluding 1.2 mass % through 1.5 mass %). Ag forms intermetallic compound, Ag3Sn with Sn and contributes to improvement in the thermal fatigue resistance (heat cycle resistance characteristics). Ag also has effects of improving wettability to a portion to be soldered at the soldering time and making liquidus temperature fall.

When the addition amount of Ag is less than 1.2 mass % (Ag<1.2), the wettability (wetting extendability) falls and when it is more than 4.5 mass % (4.5<Ag), the improvement in the thermal fatigue resistance and the wettability so that Ag is added is not only able to be unexpected but also the liquidus temperature rises, thereby deteriorating solderability. Since Ag is expensive, it is preferable in economy that an addition amount thereof is as little as possible. It is particularly preferable that the addition amount of Ag is of 2 mass % through 4 mass % within the above-mentioned range, and among them, it is preferable that the addition amount of Ag is of 2.5 mass % through 3.5 mass %.

(2) Regarding Addition Amount (0.25 mass % through 0.75 mass %) of Cu

It is preferable that the addition amount of Cu is not less than 0.25 mass % and not more than 0.75 mass % (0.25<Cu<0.75). When the addition amount of Cu is less than 0.25 mass % (Cu<0.25), the shear strength properties (shear properties) and the wettability (wetting extendability) on an interface of the joined solder portion deteriorate and when the addition amount of Cu is more than 0.75 mass % (0.75<Cu), the wettability (wetting extendability) particularly deteriorates. Therefore, in order to aim any further improvement in overall characteristics of the lead-free solder, it is necessary that the addition amount of Cu is limited to be not more than 0.75 mass % (Cu<0.75). It is particularly preferable that the content of Cu is of 0.3 mass % through 0.75 mass % within the above-mentioned range, and among them, it is further preferable that the content of Cu is of 0.5 mass % through 0.75 mass %.

(3) Regarding Addition Amount (1 mass % through 5.8 mass %) of Bi

It is preferable that the addition amount of Bi is not less than 1 mass % and not more than 5.8 mass % ($1 \leq Bi \leq 5.8$) (excluding 1.0 mass % through 1.3 mass %). Even when Bi exceeding the upper limit thereof is added (5.8<Bi) and Bi falling short of the lower limit thereof is added (Bi<1), the thermal fatigue resistance deteriorates (falls down) in both case. Therefore, it is preferable that the addition amount of Bi is of 1 mass % through 5.8 mass %, and among them, it is preferable that the addition amount of Bi is of 1 mass % through 5 mass %, and it is particularly preferable that the addition amount of Bi is of 3 mass % through 5 mass %. When the addition amount thereof exceeds 5 mass % (5<Bi), an independent phase of Bi appears. Since Bi is naturally fragile metal, impact characteristics thereof deteriorates. Further, in this extent, a melting temperature range (a difference between solidus temperature and liquidus temperature) becomes wide so that in a mounting step, a mounting failure such as misalignment of parts may occur.

(4) Regarding Addition Amount (0.01 mass % through 0.15 mass %) of Ni

It is preferable that the addition amount of Ni is more than 0.01 mass % and less than 0.1 mass %.

The addition of Ni is necessary to enable the thermal fatigue resistance to be further improved and to enable mechanical strength of the solder alloy itself to be enhanced. When the addition amount thereof is less than 0.01 mass % (Ni<0.01), the thermal fatigue resistance is not improved and when it exceeds 0.15 mass % (0.15<Ni), the wettability (wetting extendability) deteriorates. Therefore, it is preferable that the addition amount thereof is 0.02 mass % and less than 0.1 mass % within the above-mentioned range, and it is further preferable that the addition amount thereof is 0.3 mass % and less than 0.1 mass %.

(5) Regarding Other Addition Amounts

To the lead-free solder according to this invention, P or Ge in addition to the above-mentioned essential additives may be added. This is because they prevent the solder from being oxidized and restrain a color of a surface of the solder from changing. Accordingly, it is possible to add a total amount of 0.0002 mass % through 0.05 mass % of at least one selected from the group consisting of P and Ge to the above-mentioned essential additives. Their additions allow the overall characteristics of the lead-free solder to be further improved.

When the total addition amount of P, Ge falls short of 0.0002 mass %, there is no antioxidant effect. When the total addition amount thereof exceeds 0.05 mass %, the solderability (wettability and shear strength properties) deteriorates. When they separately are added, it is preferable that an addition amount of P is of 0.0002 mass % and it is preferable that an addition amount of Ge is of 0.03 mass %.

According to this invention, it is possible to obtain properties (solder overall characteristics) shown in a table 1 by selecting the addition amounts of Sn, Ag, Cu, Bi and Ni as the above-mentioned ones in the lead-free solder containing Sn, Ag, Cu, Bi and Ni. The wettability (wetting extendability), the shear strength properties (by shear test) and the thermal fatigue resistance (by thermal fatigue test) were tested.

Shapes of the lead-free solder according to the invention are not particularly limited. It may be formed as any optional useful one such as a line (wire), a ball, powder, a pellet, a preform, a rod shape one, a massive one or solder plating for Cu core ball.

Further, the lead-free solder according to this invention can decrease alpha dose by using any material of low alpha emission. Such solder is used around a memory so that any software error can be prevented.

(a) Regarding Thermal Fatigue Resistance Test

The thermal fatigue resistance test was judged using solder balls each having a diameter of 0.3 mm, which had been made by a gas droplet-spraying method. The solder balls were made with addition (mixed) amounts thereof being changed by the number of samples shown in tables 1 through 5. In other words, substrates to be judged were made by the number of samples and the thermal fatigue resistance test was performed thereon. The thermal fatigue resistance test was performed on the basis of the following procedures. Chips to be used as samples were WL-CSP chips.

(i) The solder balls each having the same composition were mounted on electrodes of WL-CSP chip (its size is of 7×7 mm) as shown in FIG. 2 and reflow soldering was performed on them using flux (Flux WF-6400 made by Senju Metal Industrial K.K.) so that the WL-CSP chips (sample chips) were manufactured. The solder balls of sample chips were prepared by the number of samples shown in the tables 1 through 5.

(ii) Printing was performed according to electrode patterns with solder paste on a glass epoxy substrate (for example, FR-4) having a size (30×120 mm) and a thickness of 0 8 mm and then, the sample chips were mounted thereon and a reflow process was performed thereon. In this embodiment, the substrates to be judged were manufactured by performing the reflow process at temperature of 220 degrees C. or more (peak temperature of 245 degrees C.) during 40 seconds.

(iii) Using the substrates to be judged, which were manufactured in the item (ii), their resistance values were measured by series circuits at all times. In this embodiment, using thermal shock chamber TSA101LA, made by ESPEC Corporation, load as one thermal cycle (heat cycle) in which the temperature of −40 degrees C. was applied during 10 minutes and then, the temperature of +125 degrees C. was applied during 10 minutes was applied thereto. The resistance value was then obtained in each thermal cycle. When the resistance value thereof rose up to a double one from initial resistance value thereof (3Ωthrough 5Ω), it was judged as fatigue fracture. The number of thermal cycles up to that time was totaled. This totaled values were used as a result of thermal fatigue resistance test (cycles). In this embodiment, 1000 cycles were set as a minimal required value and the minimal required value or more was set as appropriated one.

(b) Wettability (Wetting Extendability (square mm))

A glass epoxy substrate (FR-4) having a thickness of 1.2 mm was first prepared and a slit-shaped electrode with 0.24 mm by 16 mm were formed thereon. Flux (flux WF-6400 made by Senju Metal Industrial K. K.) having a diameter of 0.24 mm was printed on the slit-shaped electrode so that its thickness became 0.1 mm A sample was made so that solder balls each having a diameter of 0.3 mm were mounted on the printed flux and a reflow was performed thereon under a condition where the temperature is applied at 220 degrees C. or more during 40 seconds and a peak temperature is 245 degrees C. After the reflow was performed, by using a stereoscopic microscope, wetting extendability area of this sample was measured according to JIS Z3197. When the wetting extendability thereof was 0.20 mm$^2$ (square mm) or more, this sample was judged as appropriate one.

(c) Shearing Test (Shear Strength Test)

A glass epoxy substrate (FR-4) having a thickness of 1.2 mm and an electrode diameter of 0.24 mm was first prepared. Next, flux (flux WF-6400 made by Senju Metal Industrial K. K.) having a diameter of 0.24 mm and a thickness of 0.1 mm was printed on this electrode. Solder balls each having a diameter of 0.3 mm were mounted on the upper surface of the flux and a reflow was performed thereon under this condition at 220 degrees C. or more (with peak temperature of 245 degrees C.) during 40 seconds. The shear strength was measured by the shearing test (shear strength test) using the reflowed samples.

As an apparatus for measuring the shear strength, SERIES 4000HS made by Dage Corporation was used and the shear strength (Newton, N) was measured under the condition of 4000 mm/sec. Based on a result of the shearing test, the sample indicating 3.0 N or more was good item. In this case, a plurality of solder balls having different addition amounts shown in tables 1 through 5 was prepared and performed.

The following Will describe results of the above-mentioned tests, with reference to the tables 1 through 5, in lead-free solder of quinary system when a combination of Sn, Ag, Cu, Bi and Ni was selected so that Ag is of 1.2 mass % through 4.5 mass % (excluding 1.2 mass % through 1.5 mass %), Cu is of 0.25 mass % through 0.75 mass %, Bi is of 1 mass % through 5.8 mass % (excluding 1.0 mass % through 1.3 mass %), Ni is more than 0.01 mass % and less than 0.1 mass % and the remainder is Sn. Further, since any other metal such as P, Ge and the like other than these five metals can be added, their embodiments will be described together with them. Additionally, in comparison examples, addition amount of each metal selected in this invention was selected so as to be less than the lower limit thereof or to be more than the upper limit thereof and addition amount of the metal other than them was selected so that it is limited within the above-mentioned values of this invention.

TABLE 1

| | COMPOSITION (MASS %) | | | | | | | MELTING POINT (° C.) | THERMAL FATIGUE TEST (CYCLES) | WETTING EXTENDABILITY (mm$^2$) | SHEARING TEST (N) |
|---|---|---|---|---|---|---|---|---|---|---|---|
| | Sn | Ag | Cu | Bi | Ni | P | Ge | | | | |
| EMBODIMENT 1 | bal. | 2 | 0.3 | 1 | 0.02 | | | 225 | 1100 | 0.21 | 3.7 |
| EMBODIMENT 2 | bal. | 2 | 0.5 | 1 | 0.02 | | | 222 | 1140 | 0.21 | 3.9 |
| EMBODIMENT 3 | bal. | 2 | 0.5 | 3 | 0.1 | | | 217 | 1380 | 0.24 | 3.8 |
| EMBODIMENT 4 | bal. | 2 | 0.75 | 1 | 0.02 | | | 221 | 1110 | 0.22 | 4.2 |
| EMBODIMENT 5 | bal. | 2 | 0.75 | 3 | 0.02 | | | 216 | 1390 | 0.26 | 3.6 |
| EMBODIMENT 6 | bal. | 3 | 0.5 | 3 | 0.1 | | | 216 | 1420 | 0.26 | 4 |
| EMBODIMENT 7 | bal. | 3 | 0.7 | 3 | 0.1 | | | 216 | 1400 | 0.25 | 4.1 |
| EMBODIMENT 8 | bal. | 3.5 | 0.75 | 5 | 0.1 | | | 216 | 1450 | 0.25 | 4.1 |
| EMBODIMENT 9 | bal. | 4 | 0.3 | 1 | 0.02 | | | 222 | 1200 | 0.25 | 3.5 |
| EMBODIMENT 10 | bal. | 4 | 0.5 | 1 | 0.02 | | | 222 | 1200 | 0.25 | 3.7 |
| EMBODIMENT 11 | bal. | 4 | 0.5 | 3 | 0.15 | | | 216 | 1370 | 0.26 | 4.6 |
| EMBODIMENT 12 | bal. | 4 | 0.75 | 1 | 0.02 | | | 221 | 1230 | 0.26 | 3.9 |
| EMBODIMENT 13 | bal. | 4 | 0.75 | 5 | 0.15 | | | 215 | 1420 | 0.28 | 4.6 |
| EMBODIMENT 14 | bal. | 2 | 0.3 | 1 | 0.02 | 0.0002 | | 225 | 1110 | 0.21 | 3.7 |
| EMBODIMENT 15 | bal. | 4 | 0.75 | 5 | 0.15 | | 0.03 | 215 | 1440 | 0.24 | 4.6 |
| COMPARISON EXAMPLE 1 | bal. | 1 | 0.3 | 1 | 0.02 | | | 227 | 850 | 0.14 | 3.4 |

TABLE 1-continued

| | COMPOSITION (MASS %) | | | | | | MELTING POINT (° C.) | THERMAL FATIGUE TEST (CYCLES) | WETTING EXTENDABILITY (mm²) | SHEARING TEST (N) |
|---|---|---|---|---|---|---|---|---|---|---|
| | Sn | Ag | Cu | Bi | Ni | P | Ge | | | | |
| COMPARISON EXAMPLE 2 | bal. | 5 | 0.75 | 5 | 0.15 | | | 247 | 970 | 0.16 | 4.4 |
| COMPARISON EXAMPLE 3 | bal. | 2 | 0.2 | 1 | 0.02 | | | 226 | 1030 | 0.2 | 2.6 |
| COMPARISON EXAMPLE 4 | bal. | 4 | 0.8 | 5 | 0.15 | | | 215 | 1480 | 0.19 | 4.2 |
| COMPARISON EXAMPLE 5 | bal. | 2 | 0.3 | 0.9 | 0.02 | | | 226 | 990 | 0.19 | 3.5 |
| COMPARISON EXAMPLE 6 | bal. | 4 | 0.75 | 6 | 0.15 | | | 214 | 890 | 0.27 | 3.6 |
| COMPARISON EXAMPLE 7 | bal. | 4 | 0.75 | 5 | 0.16 | | | 216 | 1370 | 0.19 | 4.5 |

(i) Regarding Overall Characteristics

The table 1 shows overall characteristics of the lead-free solder according to this invention. Embodiments 1 through 5 and 14 indicate experiment data when Ag is fixed at 2.0 mass %. As addition amounts of the metals other than Ag, the embodiment 1 indicates numerical values when their lower limits of this invention are all selected. The embodiment 2 indicates numerical values when only Cu is slightly increased from the above-mentioned lower limit thereof. The embodiment 3 indicates numerical values when intermediate values are selected in all of the metals other than Ag. The embodiment 4 indicates numerical values when the upper limit value is selected only in Cu and the above-mentioned lower limit values are selected in all of the metals other than Cu. The embodiment 5 indicates numerical values when the above-mentioned lower limit value is selected in Ni, the upper limit value is selected in Cu and the intermediate value (3.0) is selected in Bi. The embodiment 14 indicates data when the values are set as the same values of the embodiment 1 and P as additive metal is added by 0.0002 mass % which is the lower limit value thereof.

According to these embodiments 1 through 5 and 14, the thermal fatigue resistance test indicated values (1100 through 1390 times), all of which exceeded the minimal required value (1000 times) thereof. The wetting extendability test also obtained values (0.21 through 0.26), all of which exceeded the minimal required value (0.2) thereof. The shearing test indicated values (3.6 through 4.2) which exceeded considerably from the minimal required value (3.0) thereof. The embodiment 14 also has so an effect as to prevent the solder from being oxidized and to restrain the color of the surface of the solder from changing. Accordingly, satisfied results obtained in all of tests.

The embodiment 6 indicates experimental data when addition amounts of all the metals are selected to be almost intermediate values thereof (Ag of 3.0; Cu of 0.5; Bi of 3.0 and Bi of 0.1). In this case, good results obtained in all the thermal fatigue resistance tests, the wetting test and the shearing test.

The embodiment 7 indicates experimental data when only Cu in the metals of the embodiment 6 is changed to be 0.7. In this case, results which are almost the same as those of the embodiment 6 obtained. In this connection, the results were so that the thermal fatigue test indicated 1400 times, the wetting test indicated 0.25 and the shearing test indicated 4.1.

In the embodiments 9 through 13 and 15, Ag is fixed to be its upper limit value of 4.0. The embodiment 9 indicates experimental data when all the others are set to be the above-mentioned lower limit values. The embodiment 10 indicates experimental data when Cu is set to be its intermediate value of 0.5 and the remainders are set to be the above-mentioned lower limit values. The embodiment 11 indicates experimental data when Cu and Bi are set to be their intermediate values of 0.5 and 3.0 and Ni is set to be its upper limit value of 0.15. The embodiment 12 indicates experimental data when Cu is set to be its upper limit value and Bi and Ni are set to be their lower limit values of 1 and 0.02. The embodiment 13 indicates experimental data when Cu and Ni are set to be their upper limit values of 0.75 and 5.0 and Bi is set to approach to its upper limit value of 5.0. The embodiment 15 indicates data when the values are set to be the same as those of the embodiment 13 and Ge as an additive metal is selected, an addition amount of which is only 0.03 mass % that approaches to the upper limit value thereof.

According to these embodiments 9 through 13 and 15, there were slight variations (1200 through 1440) and (3.5 through 4.6) in the thermal fatigue resistance test and the shearing test but the wetting extendability test nearly maintained values of 0.24 through 0.28, which obtained good results. All the tests obtained satisfied results and had so an effect as to prevent the solder from being oxidized and to restrain the color of the surface of the solder from changing.

The comparison examples 1 and 2 indicate cases where the amounts of Ag are selected so that they are without their range of this invention. The comparison example 1 indicates characteristics when the lower limit value of Ag is selected to be 1 which is lower than that of this invention. The comparison example 2 indicates characteristics when the upper limit value of Ag is selected to be 5 which are higher than that of this invention.

As clearly shown in this table, in both of the comparison examples, the result of the shearing test indicated satisfied values (3.0 or more) but the thermal fatigue resistance test did not obtain set times (target times) of 1000 cycles or more and the wetting extendability could not obtain a predetermined value (0.2 or more).

Therefore, it is preferable that an amount of Ag to be added is within a range of 1.2 mass % through 4.5 mass % (excluding 1.2 mass % through 1.5 mass %). Its particularly preferable range includes the intermediate value thereof, which will be described later.

The comparison examples 3 and 4 indicate cases where the amounts of Cu are selected so that they are without their range of this invention. The comparison example 3 indicates characteristics when the lower limit value of Cu is selected to be 0.2 which is lower than that of this invention. The comparison example 4 indicates characteristics when the upper limit value of Cu is selected to be 0.8 which are higher than that of this invention.

As clearly shown in this table, in the comparison example 3, the result of the shearing test indicated 2.6 which did not satisfy the minimal required value (3.0 or more). In the comparison example 4, the wetting extendability indicated 0.19 which was lower than the minimal required value (0.2). Accordingly, it is determined that an addition amount of Cu covering all the characteristics is preferably within a range of 0.25 mass % through 0.75 mass %.

The comparison examples 5 and 6 indicate cases where the amounts of Bi are selected so that they are without the range of this invention. The comparison example 5 indicates characteristics when the lower limit value of Bi is selected to be 0.9 which is lower than that of this invention. The comparison example 6 indicates characteristics when the upper limit value of Bi is selected to be 6 which are higher than that of this invention.

As clearly shown in this table, in both of the comparison examples, the thermal fatigue resistance test did not obtain the times which exceed the minimal required times of 1000 cycles or more. Regarding the wetting extendability, the comparison example 5 did not satisfy the predetermined value (0.2 or more). Accordingly, it is said that addition amount of Bi to be added is preferably within a range of 1 through 5.8.

The comparison example 7 indicates a case where the amount of Ni is selected so that it is without the range of this invention and indicates characteristics when Ni is selected to be 0.16 which is higher than that of this invention.

As clearly shown in this table, the comparison example 7 indicated the wetting extendability of 0.19 which was lower than the minimal required value (0.2). Accordingly, it is determined that addition amount of Ni is preferably 0.15 mass % or less.

The embodiment 8 indicates a case where composition of respective metals is selected so that they are optimally mixed, in which Ag is 3.5 mass %, Cu is 0.75 mass %, Bi is 5.0 mass % and Ni is 0.1 mass %. As clearly shown in this table, appropriate results were obtained in all of the melting point (216 degrees C.), the thermal fatigue resistance test (1450 cycles), the wetting extendability (0.25 square mm) and the shearing test (4.1 N). The following will describe suitable amount of each composite part.

(ii) Regarding the Amount of Ag

Figure 3:
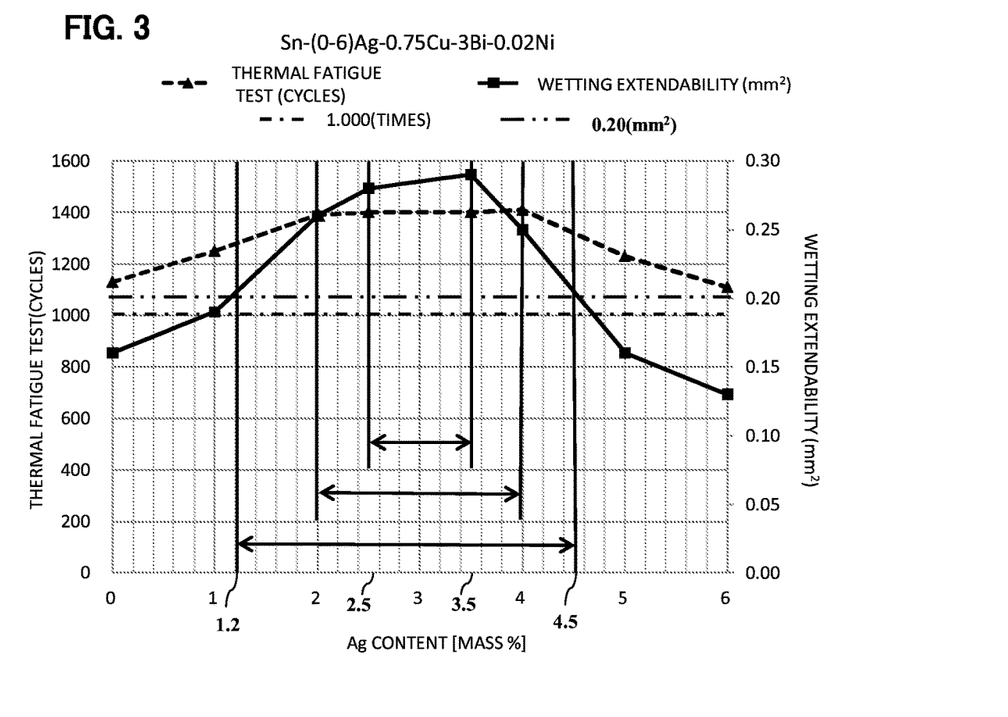
FIG. 3 is a graph showing a relationship between content of Ag and thermal fatigue resistance or wettability in the lead-free solder according to this invention.

Table 2 indicates the thermal fatigue resistance and the wettability when amounts of Cu, Bi and Ni are fixed, amount of Ag is changed and the remainder is Sn (Ag=0-6.0; Cu=0.75; Bi=3.0 and Ni=0.02). The amount of Ag is selected so as to be 0 in the comparison example 8; It is selected so as to be 1, which is lower than that of this invention, in the comparison example 9; It is selected so as to be 2 in the embodiment 5; It is selected so as to be 2.5 in the embodiment 16; It is selected so as to be 3.5 in the embodiment 17; It is selected so as to be 4 in the embodiment 18; It is selected so as to be 5, which is higher than that of this invention, in the comparison example 10; and It is selected so as to be 6, which is further higher, in the comparison example 11. They are graphed and shown in FIG. 3. The minimal required values of the above-mentioned characteristics are also shown in this figure.

Additionally, when the sample has the same component ratio as the component ratio shown in the table 1, it has been described with the same sample title (embodiment, comparison example) and the same sample number being attached thereto. The same will apply to the following.

TABLE 2

|  | COMPOSITION (MASS %) | | | | | THERMAL FATIGUE TEST (CYCLES) | WETTING EXTENDABILITY (mm$^2$) |
| --- | --- | --- | --- | --- | --- | --- | --- |
|  | Sn | Ag | Cu | Bi | Ni | | |
| COMPARISON EXAMPLE 8 | bal. | 0 | 0.75 | 3 | 0.02 | 1130 | 0.16 |
| COMPARISON EXAMPLE 9 | bal. | 1 | 0.75 | 3 | 0.02 | 1250 | 0.19 |
| EMBODIMENT 5 | bal. | 2 | 0.75 | 3 | 0.02 | 1390 | 0.26 |
| EMBODIMENT 16 | bal. | 2.5 | 0.75 | 3 | 0.02 | 1400 | 0.28 |
| EMBODIMENT 17 | bal. | 3.5 | 0.75 | 3 | 0.02 | 1400 | 0.29 |
| EMBODIMENT 18 | bal. | 4 | 0.75 | 3 | 0.02 | 1410 | 0.25 |
| COMPARISON EXAMPLE 10 | bal. | 5 | 0.75 | 3 | 0.02 | 1230 | 0.16 |
| COMPARISON EXAMPLE 11 | bal. | 6 | 0.75 | 3 | 0.02 | 1110 | 0.13 |

As clearly shown in this table, in all of the comparison examples and embodiments, the thermal fatigue resistance indicated satisfied values (1000 cycles or more). The wettability, however, indicated 0.16 mm$^2$ (square mm) in the comparison example 8 and indicated 0.19 mm$^2$ (square mm) in the comparison example 9, which were merely lower than the minimal required value (0.2). On the other hand, regarding the wetting extendability, the embodiment 5 and 16 through 18 obtained satisfied results (0.25-0.29). Among them, the measured values of the wetting extendability in the embodiments 16 and 17 were particularly satisfied data (0.28 and 0.29). Further, Ag had the best mode thereof when it was 3.5 mass %.

Therefore, it is preferable that the amount of Ag to be added is within a range of 1.2 mass % through 4.5 mass % (excluding 1.2 mass % through 1.5 mass %). It is preferable that the amount thereof is within a range of 2 mass % through 4 mass % even in the above-mentioned range. It is particularly preferable that the amount thereof is within a range of 2.5 mass % through 3.5 mass %.

(iii) Regarding the Amount of Ag

Figure 4:
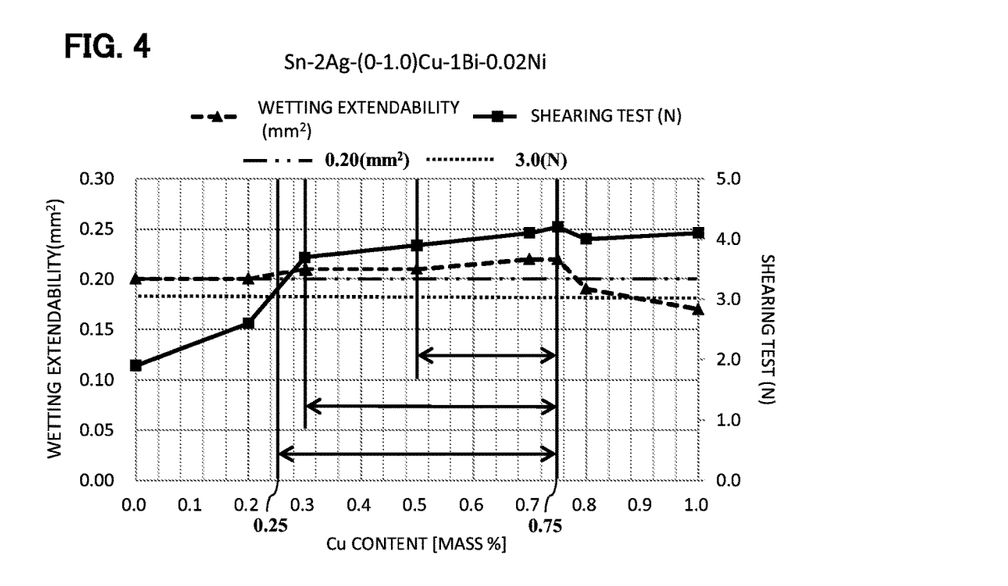
FIG. 4 is a graph showing a relationship between content of Cu and wettability or shear properties in the lead-free solder according to this invention.

Table 3 indicates the wettability and the shear properties when amounts of Ag, Bi and Ni are fixed, amount of Cu is changed and the remainder is Sn (Ag=2.0; Cu=0-1.0; Bi=1 and Ni=0.02). The amount of Cu is selected so as to be 0 inthe comparison example 12; It is selected so as to be 0.2, which is lower than that of this invention, in the comparison example 3; It is selected so as to be 0.3 in the embodiment 1; It is selected so as to be 0.5 in the embodiment 2; It is selected so as to be 0.7 in the embodiment 19; It is selected so as to be 0.75 in the embodiment 4; It is selected so as to be 0.8, which is higher than that of this invention, in the comparison example 13; and It is selected so as to be 1, which is further higher, in the comparison example 14. They are graphed and shown in FIG. 4. The minimal required values of the above-mentioned characteristics are also shown in this figure.

TABLE 3

| | COMPOSITION (MASS %) | | | | WETTING EXTENDABILITY | SHEARING TEST |
|---|---|---|---|---|---|---|
| | Sn | Ag | Cu | Bi | Ni | (mm²) | (N) |
| COMPARISON EXAMPLE 12 | bal. | 2 | 0 | 1 | 0.02 | 0.2 | 1.9 |
| COMPARISON EXAMPLE 3 | bal. | 2 | 0.2 | 1 | 0.02 | 0.2 | 2.6 |
| EMBODIMENT 1 | bal. | 2 | 0.3 | 1 | 0.02 | 0.21 | 3.7 |
| EMBODIMENT 2 | bal. | 2 | 0.5 | 1 | 0.02 | 0.21 | 3.9 |
| EMBODIMENT 19 | bal. | 2 | 0.7 | 1 | 0.02 | 0.22 | 4.1 |
| EMBODIMENT 4 | bal. | 2 | 0.75 | 1 | 0.02 | 0.22 | 4.2 |
| COMPARISON EXAMPLE 13 | bal. | 2 | 0.8 | 1 | 0.02 | 0.19 | 4 |
| COMPARISON EXAMPLE 14 | bal. | 2 | 1 | 1 | 0.02 | 0.17 | 4.1 |

The comparison examples 3 and 12 satisfied the minimal required value of the wetting extendability but the results (2.6 and 1.9) of the shearing test did not satisfy the minimal required value (3.0 or more) thereof. In the comparison examples 13 and 14, results of the shearing test satisfied the minimal required value thereof but values (0.19 and 0.17) of the wetting extendability test did not reach the minimal required value (0.2 or more) thereof. On the other hand, the embodiments 1, 2, 4 and 19 obtained good results (0.21 through 0.22) in the wetting extendability and good results (3.7through 4.2) in the shearing test. Particularly, the wetting extendability of the embodiments 2, 4 and 19 was very good values (3.9 through 4.2). Further, Cu had the best mode thereof when it was 0.75 mass %.

Therefore, it is preferable that the amount of Cu to be added is within a range of 0.25 mass % through 0.75 mass %. It is preferable that the amount thereof is within a range of 0.3 mass % through 0.75 mass % even in the above-mentioned range. It is particularly preferable that the amount thereof is within a range of 0.5 mass % through 0.75 mass %.

(iv) Regarding the Amount of Bi

Figure 5:
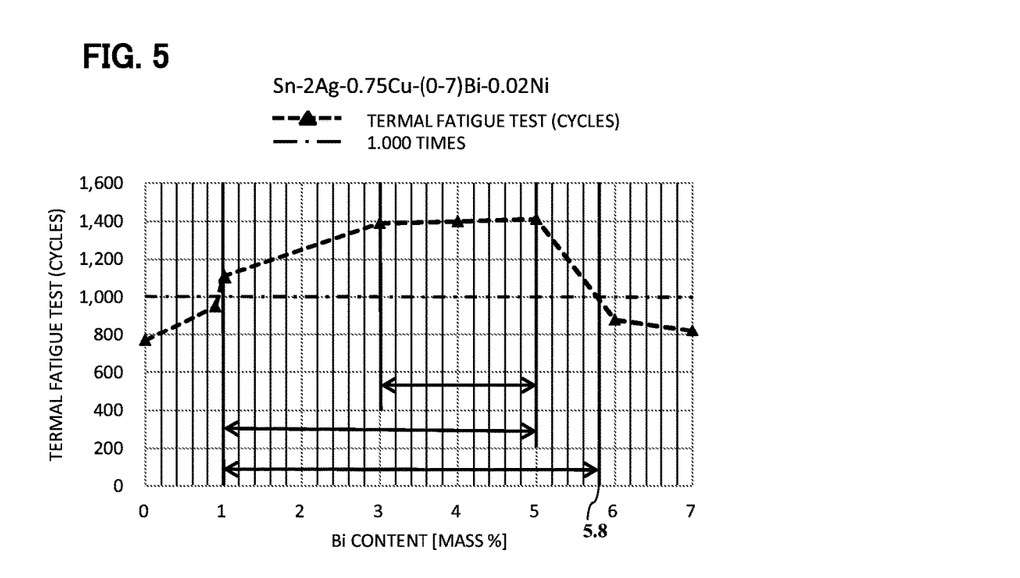
FIG. 5 is a graph showing a relationship between content of Bi and thermal fatigue resistance in the lead-free solder according to this invention.

Table 4 indicates the thermal fatigue resistance when amounts of Ag, Cu and Ni are fixed, amount of Bi is changed and the remainder is Sn (Ag=2.0; Cu=0.75; Bi=0-7.0 and Ni=0.02). The amount of Bi is selected so as to be 0 in the comparison example 15; It is selected so as to be 0.9, which is lower than that of this invention, in the comparison example 16; It is selected so as to be 1 in the embodiment 4; It is selected so as to be 3 in the embodiment 5; It is selected so as to be 4 in the embodiment 20; It is selected so as to be 5 in the embodiment 21; It is selected so as to be 6, which is higher than that of this invention, in the comparison example 17; and It is selected so as to be 7, which is further higher, in the comparison example 18. They are graphed and shown in FIG. 5. The minimal required values of the above-mentioned characteristics are also shown in this figure.

TABLE 4

| | COMPOSITION (MASS %) | | | | | THERMAL FATIGUE TEST |
|---|---|---|---|---|---|---|
| | Sn | Ag | Cu | Bi | Ni | (CYCLES) |
| COMPARISON EXAMPLE 15 | bal. | 2 | 0.75 | 0 | 0.02 | 770 |
| COMPARISON EXAMPLE 16 | bal. | 2 | 0.75 | 0.9 | 0.02 | 950 |
| EMBODIMENT 4 | bal. | 2 | 0.75 | 1 | 0.02 | 1110 |

TABLE 4-continued

| | COMPOSITION (MASS %) | | | | | THERMAL FATIGUE TEST |
|---|---|---|---|---|---|---|
| | Sn | Ag | Cu | Bi | Ni | (CYCLES) |
| EMBODIMENT 5 | bal. | 2 | 0.75 | 3 | 0.02 | 1390 |
| EMBODIMENT 20 | bal. | 2 | 0.75 | 4 | 0.02 | 1400 |
| EMBODIMENT 21 | bal. | 2 | 0.75 | 5 | 0.02 | 1410 |
| COMPARISON EXAMPLE 17 | bal. | 2 | 0.75 | 6 | 0.02 | 880 |
| COMPARISON EXAMPLE 18 | bal. | 2 | 0.75 | 7 | 0.02 | 820 |

In all of the comparison examples, the results of the thermal fatigue resistance test did not satisfy the minimal required value (1000 cycles) thereof. On the other hand, by the above-mentioned test, all of the embodiments indicated the results (1110 through 1410) exceeding the minimal required value (1000 cycles) thereof. Among them, the values of the embodiments 5, 20 and 21 (respectively, 1390, 1400 and 1410) were particularly good results. Further, Bi had the best mode thereof when it was 5.0 mass %.

Therefore, it is preferable that the amount of Bi to be added is within a range of 1.0 mass % through 5.8 mass %. It is preferable that the amount thereof is within a range of 1.0 mass % through 5.0 mass % even in the above-mentioned range. It is particularly preferable that the amount thereof is within a range of 3.0 mass % through 5.0 mass %.

(v) Regarding the Amount of Ni

Figure 6:
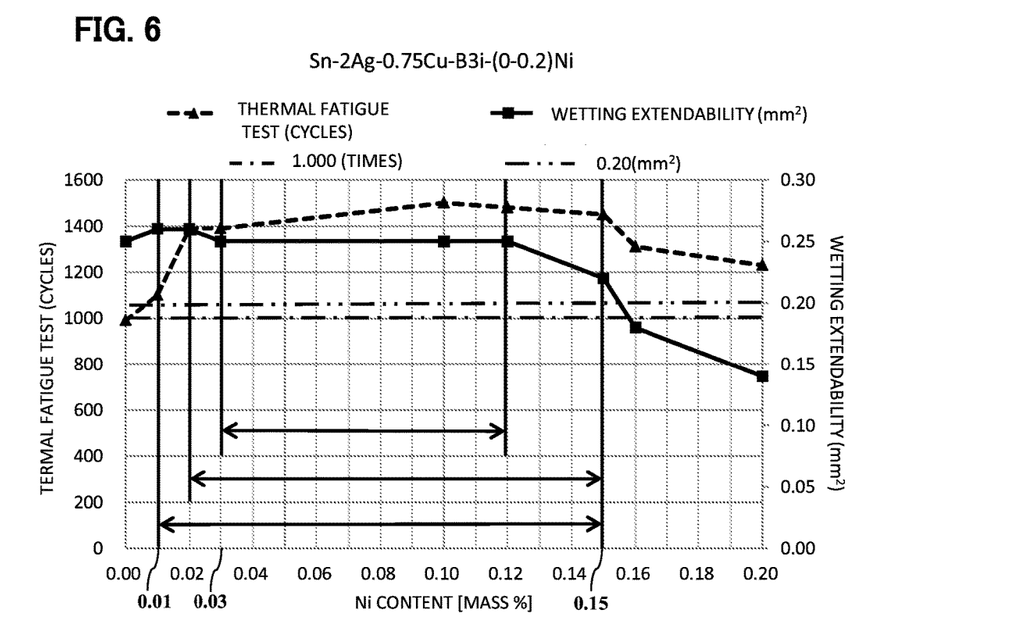
FIG. 6 is a graph showing a relationship between content of Ni and thermal fatigue resistance or wettability in the lead-free solder according to this invention.

Table 5 indicates the thermal fatigue resistance and the wettability when amounts of Ag, Cu and Bi are fixed, amount of Ni is changed and the remainder is Sn (Ag=2.0; Cu=0.75; Bi=3.0 and Ni=0-0.20). The amount of Ni is selected so as to be 0 in the comparison example 19; It is selected so as to be 0.01, which is the lower limit value of this invention, in the comparison example 22; It is selected so as to be 0.02 in the embodiment 5; It is selected so as to be 0.03 in the embodiment 23; It is selected so as to be 0.1 in the embodiment 24; It is selected so as to be 0.12 in the embodiment 25; It is selected so as to be 0.15 in the embodiment 26; It is selected so as to be 0.16, which is higher than that of this invention, in the comparison example 20; and It is selected so as to be 0.20, which is further higher, in the comparison example 21. They are graphed and shown in FIG. 6. The minimal required values of the above-mentioned characteristics are also shown in this figure.

TABLE 5

| | COMPOSITION (MASS %) | | | | | THERMAL FATIGUE TEST | WETTING EXTENDABILITY |
|---|---|---|---|---|---|---|---|
| | Sn | Ag | Cu | Bi | Ni | (CYCLES) | (mm²) |
| COMPARISON EXAMPLE 19 | bal. | 2 | 0.75 | 3 | 0 | 990 | 0.25 |
| EMBODIMENT 22 | bal. | 2 | 0.75 | 3 | 0.01 | 1100 | 0.26 |
| EMBODIMENT 5 | bal. | 2 | 0.75 | 3 | 0.02 | 1390 | 0.26 |
| EMBODIMENT 23 | bal. | 2 | 0.75 | 3 | 0.03 | 1390 | 0.25 |
| EMBODIMENT 24 | bal. | 2 | 0.75 | 3 | 0.1 | 1500 | 0.25 |
| EMBODIMENT 25 | bal. | 2 | 0.75 | 3 | 0.12 | 1480 | 0.25 |
| EMBODIMENT 26 | bal. | 2 | 0.75 | 3 | 0.15 | 1450 | 0.22 |
| COMPARISON EXAMPLE 20 | bal. | 2 | 0.75 | 3 | 0.16 | 1310 | 0.18 |
| COMPARISON EXAMPLE 21 | bal. | 2 | 0.75 | 3 | 0.2 | 1230 | 0.14 |

In the comparison example 19, the thermal fatigue resistance test did not reach the target cycles (1000 cycles) thereof. In the comparison examples 20 and 21, it was impossible to obtain a predetermined vale (0.2 or more) in the wetting extendability. The embodiment 22 indicated the results of the thermal fatigue resistance and the wettability (respectively, 1100 cycles and 0.26 square mm) which satisfied their minimal required values. The embodiments 5 and 23 through 26 obtained the results (1390 through 1500 and 0.22 through 0.26) of the thermal fatigue resistance test and the wetting extendability test, which exceeded their minimal required values. Particularly, the embodiments 5 and 23 through 26 obtained the good results (1390 through 1500 and 0.25 through 0.26) of both of the thermal fatigue resistance and the wettability. Further, Ni had the best mode thereof when it was 0.1 mass %.

Therefore, it is preferable that the amount of Ni to be added is within a range of 0.01 mass % through 0.15 mass %. It is preferable that the amount thereof is within a range of 0.02 mass % through 0.15 mass % even in the above-mentioned range. It is particularly preferable that the amount thereof is within a range of 0.03 mass % through 0.12 mass %.

(vi) Regarding Melting Points

Regarding the melting points, since the addition amount of the metals were selected so that liquidus temperature did not exceed 240 degrees C., values thereof (215 degrees C. through 225 degrees C.) which were relatively low values were obtained. Accordingly, it is possible to previously prevent the circuit elements from receiving any thermal damage during the reflow process.

As clearly shown in the experimental data, by using the lead-free solder which contains Ag of 1.2 mass % through 4.5 mass % (excluding 1.2 mass % through 1.5 mass %), Cu of 0.25 mass % through 0.75 mass %, Bi of 1 mass % through 5.8 mass %, Ni of 0.01 mass % through 0.15 mass % and Sn as the remainder, the intended object can be attained in this invention. Particularly, it is preferable to use the lead-free solder which contains Ag of 2 mass % through 4 mass %, Cu of 0.3 mass % through 0.75 mass %, Bi of 1 mass % through 5 mass %, Ni of 0.02 mass % through 0.15 mass % and Sn as the remainder. It is further preferable to use the lead-free solder which contains Ag of 2.5 mass % through 3.5 mass %, Cu of 0.5 mass % through 0.75 mass %, Bi of 3 mass % through 5 mass %, Ni of 0.03 mass % through 0.12 mass % and Sn as the remainder.

(vii) Regarding Lead-free Solder Ball and the Like

Under the above disclosure, the lead-free solder according to the invention was made spherical and the lead-free solder ball thus made spherical was connected to a semiconductor chip 2 to make a sample chip. By mounting this sample chip on the circuit board 7, WL-CSP chip 20 was formed. It is possible to obtain the semiconductor circuit 15 by mounting this WL-CSP chip 20 and other electronic components on the circuit board 7.

Since the good results as shown in the above-mentioned embodiments were respectively obtained when the solder properties such as the thermal fatigue resistance test, the shearing test, the wettability and the like were checked using the WL-CSP chip 20, it is easy to be understandable that all of the above-mentioned solder properties can be respectively realized in the solder joint and the semiconductor circuit in addition to the lead-free solder ball by using the solder having the compositions claimed in the claims. Therefore, it is possible to provide the lead-free solder, the lead-free solder ball, the solder joint using the lead-free solder and the semiconductor circuit, which have high reliability.

INDUSTRIAL AVAILABILITY

The present invention is available to an on-vehicle electronic circuit and consumer electronics.

DESCRIPTION OF CODES

2 . . . Semiconductor Chip;
5 . . . Solder Bump Electrodes;
7 . . . Circuit Board;
10 . . . CSP Package;
15 . . . Semiconductor Circuit; and
20 . . . WL-CSP Chip

The invention claimed is:

1. A lead-free solder comprising Ag of 2.0 mass % through 4.5 mass %; Cu of 0.25 mass % through 0.75 mass %; Bi of 3.0 mass % through 5.8 mass %; Ni of 0.01 mass % through 0.03 mass % and Sn as the remainder.

2. The lead-free solder according to claim 1 comprising Ag of 2 mass % through 4 mass %; Cu of 0.3 mass % through 0.75 mass %; Bi of 3.0 mass % through 5 mass %; Ni of 0.02 mass % through 0.03 mass % and Sn as the remainder.

3. The lead-free solder according to claim 1 comprising Ag of 2.5 mass % through 3.5 mass %; Cu of 0.5 mass % through 0.75 mass %; Bi of 3 mass % through 5 mass %; Ni of 0.03 mass % and Sn as the remainder.

4. The lead-free solder of claim 1, wherein a total amount of 0.0005 mass % through 0.05 mass % of at least one selected from the group consisting of P and Ge is added to the lead-free solder.

5. A lead-free solder ball comprising Ag of 2.0 mass % through 4.5 mass %; Cu of 0.25 mass % through 0.75 mass %; Bi of 3.0 mass % through 5.8 mass %; Ni of 0.01 mass % through 0.03 mass % and Sn as the remainder.

6. The lead-free solder ball according to claim 5 comprising Ag of 2 mass % through 4 mass %; Cu of 0.3 mass % through 0.75 mass %; Bi of 3.0 mass % through 5 mass %; Ni of 0.02 mass % through 0.03 mass % and Sn as the remainder.

7. The lead-free solder ball according to claim 5 comprising Ag of 2.5 mass % through 3.5 mass %; Cu of 0.5 mass % through 0.75 mass %; Bi of 3 mass % through 5 mass %; Ni of 0.03 mass % and Sn as the remainder.

8. The lead-free solder ball according to claim 5, wherein a total amount of 0.0005 mass % through 0.05 mass % of at least one selected from the group consisting of P and Ge is added to the lead-free solder.

9. A solder joint, wherein lead-free solder comprising Ag of 2.0 mass % through 4.5 mass %; Cu of 0.25 mass % through 0.75 mass %; Bi of 3.0 mass % through 5.8 mass %; Ni of 0.01 mass % through 0.03 mass % and Sn as the remainder is used.

10. The solder joint according to claim 9, wherein the lead-free solder comprises Ag of 2 mass % through 4 mass %; Cu of 0.3 mass % through 0.75 mass %; Bi of 3.0 mass % through 5 mass %; Ni of 0.02 mass % through 0.03 mass % and Sn as the remainder.

11. The solder joint according to claim 9, wherein the lead-free solder comprises Ag of 2.5 mass % through 3.5 mass %; Cu of 0.5 mass % through 0.75 mass %; Bi of 3 mass % through 5 mass %; Ni of 0.03 mass % and Sn as the remainder.

12. The solder joint according to claim 9, wherein a total amount of 0.0005 mass % through 0.05 mass % of at least one selected from the group consisting of P and Ge is added to the lead-free solder.

13. A semiconductor circuit, wherein lead-free solder comprising Ag of 2.0 mass % through 4.5 mass %; Cu of 0.25 mass % through 0.75 mass %; Bi of 3.0 mass % through 5.8 mass %; Ni of 0.01 mass % through 0.03 mass % and Sn as the remainder is used.

14. The semiconductor circuit according to claim 13, wherein the lead-free solder comprises Ag of 2 mass % through 4 mass %; Cu of 0.3 mass % through 0.75 mass %; Bi of 3.0 mass % through 5 mass %; Ni of 0.02 mass % through 0.03 mass % and Sn as the remainder.

15. The semiconductor circuit according to claim 13, wherein the lead-free solder comprises Ag of 2.5 mass % through 3.5 mass %; Cu of 0.5 mass % through 0.75 mass %; Bi of 3 mass % through 5 mass %; Ni of 0.03 mass % and Sn as the remainder.

16. The semiconductor circuit according to claim 13, wherein a total amount of 0.0005 mass % through 0.05 mass % of at least one selected from the group consisting of P and Ge is added to the lead-free solder.

* * * * *

UNITED STATES PATENT AND TRADEMARK OFFICE
CERTIFICATE OF CORRECTION

PATENT NO. : 10,434,608 B2
APPLICATION NO. : 14/916730
DATED : October 8, 2019
INVENTOR(S) : Ken Tachibana et al.

It is certified that error appears in the above-identified patent and that said Letters Patent is hereby corrected as shown below:

On the Title Page

Item (73), Column 1, Line 1, delete "Indsutry" and insert -- Industry --

Signed and Sealed this
Fourteenth Day of January, 2020

Andrei Iancu
*Director of the United States Patent and Trademark Office*